US008124502B2

(12) United States Patent
Ferre i Tomas (10) Patent No.: US 8,124,502 B2
(45) Date of Patent: Feb. 28, 2012

(54) SEMICONDUCTOR DEVICE MANUFACTURING METHOD, SEMICONDUCTOR DEVICE AND SEMICONDUCTOR DEVICE MANUFACTURING INSTALLATION

(75) Inventor: Rafel Ferre i Tomas, Alzenau (DE)

(73) Assignee: Applied Materials, Inc., Santa Clara, CA (US)

( * ) Notice: Subject to any disclaimer, the term of this patent is extended or adjusted under 35 U.S.C. 154(b) by 324 days.

(21) Appl. No.: 12/257,233

(22) Filed: Oct. 23, 2008

(65) Prior Publication Data

US 2010/0105190 A1   Apr. 29, 2010

(51) Int. Cl.
*H01L 21/322* (2006.01)

(52) U.S. Cl. .......... 438/476; 438/58; 438/471; 438/472; 438/473; 438/474; 438/475; 438/477; 438/558; 438/559; 438/563; 257/E21.318

(58) Field of Classification Search .............. 438/58, 438/476, 471–475, 477, 558, 559, 563; 257/E21.318
See application file for complete search history.

(56) References Cited

U.S. PATENT DOCUMENTS

| 4,279,671 A | * | 7/1981 | Komatsu | 438/310 |
| 5,904,494 A | * | 5/1999 | Hokari et al. | 438/60 |

FOREIGN PATENT DOCUMENTS

| DE | 102006041424 | * | 3/2008 | 438/58 |
| WO | WO-2008028625 A2 | | 3/2008 | |

OTHER PUBLICATIONS

International Search Report and Written Opinion dated Mar. 23, 2010, for international application PCT/EP2009/063370.
A. Benson, A. Holt, R. Kopecek, G. Stokkan, J. S. Christensen, and B. G. Svenson, *Gettering of transition metal impurities during phosphorus emitter diffusion in multicrystalline silicoo solar cell processing*, published online at J. App. Phys. 99, 093509 (May 15, 2006).
H. Lautenschlager, F. Lutz, C. Scheeter, U. Schubert, R. Schindler, *MC-Silicon Solar Cells with <17% Efficiency*, Proceedings of the 26th Photovoltaic Specialists Conference, Sep. 30, 1997-Oct. 3, 1997, pp. 7-12.
European Search Report dated Jul. 1, 2009, for application EP08167461.
R. Ferre, et al., "Effect of amorphous silicon carbide layer thickness on the passivation quality of crystalline silicon surface", American Institute of Physics, Nov. 9, 2005, 87,202109, Barcelona, Spain.
R. Ferre, et al., "n-type emitter surface passivation in c-Si solar cells by means of antireflective amorphous silicon carbide layers", American Institute of Physics, Oct. 5, 2006, 100,073703, Barcelona, Spain.
R.R. King, et al., "Studies of Diffused Phosphorus Emitters: Saturation Current, Surface Reccmbination Velocity, and Quantum Efficiency", IEEE Transactions on Electron Devices, vol. 37, No. 2, Feb. 1990.

(Continued)

*Primary Examiner* — Stephen W Smoot
*Assistant Examiner* — Vicki B Booker
(74) *Attorney, Agent, or Firm* — Patterson & Sheridan, L.L.P.

(57) ABSTRACT

A semiconductor device manufacturing method is provided, including: providing a semiconductor substrate, forming on the semiconductor substrate a layer including a semiconductor compound and a dope additive, and thereafter forming an emitter region and gettering impurities by annealing the semiconductor substrate including the layer.

17 Claims, 3 Drawing Sheets

OTHER PUBLICATIONS

M. Vetter, et al., "Solar Cells with Annealed Amorphous $Si_{0.8}C_{0.2}$/Si Heterojunction and a-$SiC_x$:H Backsurface Passivation", $3^{rd}$ World Conference on Photovoltaic Energy Conversion, May 11-18, 2003, Osaka, Japan.

A. Orpella, et al., "Fabrication and characterization of in situ-doped a-$Si_{0.6}C_{0.2}$ emitter bipolar transistors", Elsevier Science Ltd., May 31, 2000, Solid-State Electronics 44 (2000) 1543-1548.

R. Ferre, et al., "Surface and Emitter Passivation of Crystalline Silicon by Amorphous Silicon Carbide: Evolution with Annealing", $21^{st}$ European Photovoltaic Solar Energy Conference, Sep. 4-8, 2006, Dresden Germany.

A. Orpella, et al., "Phosphorus-diffused silicon solar cell emitters with plasma enhanced chemical vapor deposited silicon carbide", Solar Energy Materials & Solar Cells, Aug. 2, 2004, pp. 667-674, Elsevier B.V.

A. Orpella, et al., "In situ-Doped Amorphous $Si_{0.8}C_{0.2}$ Emitter Bipolar Transistors", IEEE Electron Device Letters, vol. 20, No. 11, Nov. 1999.

\* cited by examiner

SEMICONDUCTOR DEVICE MANUFACTURING METHOD, SEMICONDUCTOR DEVICE AND SEMICONDUCTOR DEVICE MANUFACTURING INSTALLATION

FIELD OF THE INVENTION

Embodiments of the invention relate to semiconductor devices, for instance to solar cells. They relate particularly to a semiconductor device manufacturing method, a semiconductor device and a semiconductor device manufacturing installation.

BACKGROUND OF THE INVENTION

Semiconductor devices have many functions in a plurality of industrial fields, including, but not limited to, fabrication of electronic devices, such as transistors, and photovoltaic cells, such as solar cells. Individual photovoltaic cells are e.g. used for powering small devices such as electronic calculators. Photovoltaic arrays are used for instance in remote area power systems, earth-orbiting satellites and space probes, remote radiotelephones and water pumping applications.

The principle of operation of a solar cell containing a p-n junction can be roughly described as follows. The solar cell absorbs light and generates electron/hole charge pairs due to absorbed light energy. The electrons move toward the n-layer side of the junction, and the holes move toward the p-layer side due to drift caused by the junction electric field and diffusion.

For solar cell production, so called bulk technologies or thin-film technologies may be applied, the former utilizing bulk semiconductor wafers, the latter resulting in thin-film solar cells. The most prevalent bulk material of solar cells is crystalline silicon, for instance mono-crystalline silicon (c-Si), or multi-crystalline silicon (mc-Si).

A typical solar cell production process based on mc-Si may include for instance some of the following steps: Removal of saw-damage from mc-Si wafers by etching; emitter formation by heat treatment in $POCl_3$ ambient; removal of resulting phosphorus silicate glass (PSG); front side and/or back side passivation; deposition of a front side anti-reflection coating, e.g. by Plasma Enhanced Chemical Vapor Deposition (PECVD); screen printing of rear side metallization and front contact grid lines; and annealing for rear side metal interdiffusion and firing the front contact grid lines.

Multi-crystalline silicon wafers may contain a high density of recombination centers, for instance lattice defects, e.g. impurities, such as iron (Fe) or nickel (Ni). This results in undesirable recombination of charge carriers, thereby affecting the electrical properties of the solar cell. To improve the properties of solar cells based on mc-Si, a so-called gettering of impurities, and thereby inactivation of impurities, may be performed, which typically includes a phosphorus diffusion at high temperatures. Phosphorus is able to retain, for instance, Fe and other metallic impurities in the emitter and/or surface of the solar cell, reducing the recombination due to these impurities. During phosphorus diffusion, a phosphorus silicate glass is formed, which has to be removed for the subsequent solar cell production process steps.

SUMMARY

In light of the above, semiconductor device manufacturing method according to claim 1, a semiconductor device according to claim 15 and a semiconductor device manufacturing installation according to claim 16 are provided.

According to one embodiment, a semiconductor device manufacturing method is provided, including: providing a semiconductor substrate, forming on the semiconductor substrate a layer including a semiconductor compound and a dope additive, and thereafter forming an emitter region and gettering impurities by annealing the semiconductor substrate including the layer.

According to another embodiment, a semiconductor device is provided, obtained by a semiconductor device manufacturing method, including: providing a semiconductor substrate, forming on the semiconductor substrate a layer including a semiconductor compound and a dope additive, and thereafter forming an emitter region and gettering impurities by annealing the semiconductor substrate including the layer.

According to a further embodiment, a semiconductor device manufacturing installation is provided, including a coating device adapted for coating a semiconductor substrate, a heating device adapted for annealing the coated semiconductor substrate, and a control device adapted for controlling the coating device and the heating device and adapted for performing a semiconductor device manufacturing method, the method including: providing a semiconductor substrate, forming on the semiconductor substrate a layer including a semiconductor compound and a dope additive, and thereafter forming an emitter region and gettering impurities by annealing the semiconductor substrate including the layer.

Further features and details are evident from the dependent claims, the description and the drawings.

Embodiments are also directed to apparatuses for carrying out the disclosed methods and including apparatus parts for performing described method steps. Furthermore, embodiments are also directed to methods by which the described apparatus operates or by which the described apparatus is manufactured. It may include method steps for carrying out functions of the apparatus or manufacturing parts of the apparatus. The method steps may be performed by way of hardware components, firmware, software, a computer programmed by appropriate software, by any combination thereof or in any other manner.

It is contemplated that elements of one embodiment may be advantageously utilized in other embodiments without further recitation.

BRIEF DESCRIPTION OF THE DRAWINGS

So that the manner in which the above recited features of the present invention can be understood in detail, a more particular description of embodiments of the invention, briefly summarized above, may be had by reference to embodiments. The accompanying drawings relate to embodiments of the invention and are described in the following. Some of the above mentioned embodiments will be described in more detail in the following description of typical embodiments with reference to the following drawings in which.

DETAILED DESCRIPTION OF THE DRAWINGS

Reference will now be made in detail to the various embodiments, one ore more examples of which are illustrated in the figures. Each example is provided by way of explanation, and is not meant as a limitation of the invention.

Without limiting the scope, in the following, the semiconductor device will exemplarily be referred to as solar cell. Moreover, without limiting the scope, the substrate of the semiconductor device will exemplarily be referred to as wafer or silicon wafer, also referred to as a silicon substrate. However, examples of embodiments disclosed herein may also be applied to other types of semiconductor devices, such as thin-film solar cells. Moreover, other semiconductors or semiconductor materials than silicon may be contemplated. Further, without limiting the scope, in the following, the silicon wafer will exemplarily be referred to as a multi-crystalline p-type silicon wafer. However, other types of silicon wafers may be used, such as a mono-crystalline silicon wafer and/or an intrinsic silicon wafer, e.g. a substantially pure silicon wafer. Moreover, in the following, a production of a p-n solar cell is described, wherein an n-type emitter is formed in a p-type silicon substrate. However, the principles of the method of embodiments described herein may correspondingly be used in a production of a solar cell having a reversed p-n structure. In addition, in the following, phosphorus is mentioned as an example of an n-dopant for the emitter formation. However, other n-dopants, such as arsenic, may be used.

Within the following description of the drawings, the same reference numbers refer to the same components. Generally, only the differences with respect to the individual embodiments are described.

A typical application of embodiments described herein is the manufacture of solar cells, for instance solar cells based on mc-Si.

According to one embodiment, a semiconductor device manufacturing method is provided, including: providing a semiconductor substrate, forming on the semiconductor substrate a layer including a semiconductor compound and a dope additive, and thereafter forming an emitter region and gettering impurities by annealing the semiconductor substrate including the layer. Thereby, the forming of the emitter region and gettering of impurities are performed in one step, typically simultaneously. The impurities may be gettered by the dope additive.

Figure 1A:
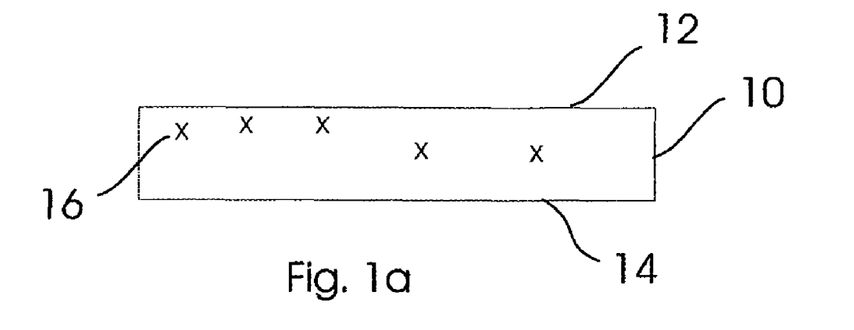
FIGS. 1a to 1c schematically illustrate steps of a semiconductor manufacturing method according to one example of embodiments.
Figure 1B:
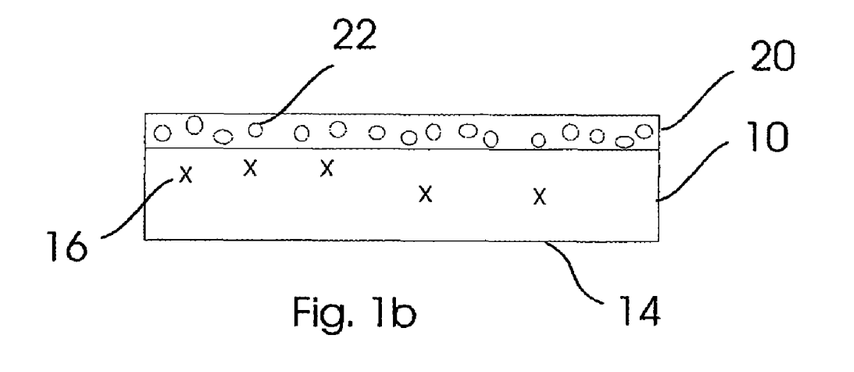
Figure 1C:
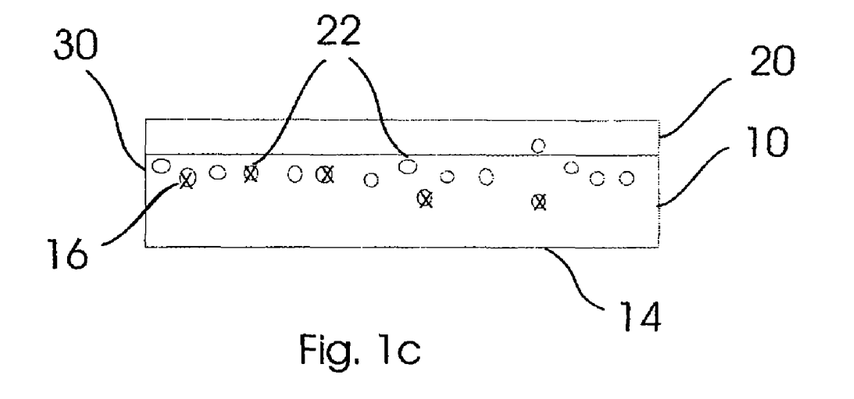

FIGS. 1a to 1c schematically illustrate steps of a semiconductor manufacturing method according to one example of embodiments. In a first step of this example, as a semiconductor substrate, a silicon substrate in the form of a p-type silicon wafer 10 shown in FIG. 1a is provided, which has a front side 12 and a back side 14. The wafer 10 includes metallic impurities 16 distributed inside of the bulk of the wafer 10. For instance, as a silicon substrate, a p-type, typically boron doped, multi-crystalline silicon wafer may be used, with a resistivity range between 0.2 to 10 Ohm cm, typically 1 Ohm cm and with a thickness up to 500 μm, typically 200 μm.

In a second step schematically illustrated in FIG. 1b, a silicon compound and a dope additive is deposited on the silicon substrate. Thereby, an amorphous silicon compound layer 20 including a dopant 22, e.g. phosphorus, is formed on the front side 12 of the wafer 10. The silicon compound may be e.g. silicon nitride or silicon carbide. In one example of embodiments, the second step may be performed by sputtering the silicon compound and the dope additive, e.g. by sputtering of a target including the silicon compound and the dope additive. During sputtering, a gas including at least one element selected from the group consisting of $CH_4$, $NH_3$ other other suitable components may be provided. In another example of embodiments, the second step is performed by PECVD of a gas mixture including $SiH_4$ and at least one element selected from the group consisting of $NH_3$, $CH_4$, and $PH_3$.

For instance, in the second step, a phosphorus doped passivation layer may be deposited on the front side 12 of the wafer 10. The resulting passivation layer may have antireflective properties, a thickness of 70-95 nm, and a refractive index at 622 nm wavelength of 1.95-2.05. The deposition may be performed as follows: In a first example, a silicon carbide layer $SiC_x(n)$:H may be deposited on the front side of the wafer 10 by PECVD. In the coating chamber a total pressure of 1 to 6 μbar and a wafer temperature of about 200 to about 500° C. may be established. For creating a plasma, a power source providing RF in the range of about 3 Hz to about 300 Hz, typically MF (Medium Frequency) in the range of about 300 to 3000 kHz may be used. As gases $SiH_4$, $CH_4$, and $PH_3$ can be introduced into the coating chamber. The deposition time may be in the range of about 1 to about 10 min. In an alternative example, for example a silicon nitride layer $SiN_x$(n), may be deposited on the front side 12 of the wafer 10 by sputtering of a phosphorus doped silicon target. In the coating chamber a total pressure of 1 to 6 μbar and a wafer temperature of about 200 to about 500° C. may be established. Into the coating chamber, Ar, $NH_3$, $N_2$, and, if the target is not phosphorus doped, optionally $PH_3$ may be introduced. For creating a plasma, a power source providing DC, RF or MF may be used. In a further example, a layer 20 including phosphorus doped silicon oxynitride may be grown on the wafer by sputtering with a phosphorus doped silicon target and $N_2$ and $O_2$ as reactive gases.

Optionally, after the second step, passivation of the back side of the wafer 10 with an intrinsic or boron doped passivation layer (not shown) may be performed. This may be done using deposition conditions similar to the conditions specified in the second step, without the presence of phosphorus dopants. This layer has to be able to keep passivation properties after the manufacturing method is finished. When a boron doped layer is chosen, there may be the additional benefit of a passivated high-low junction at the back side of the wafer, e.g. of the solar cell.

Subsequently, in a third step schematically illustrated in FIG. 1c, coated wafer 10 is annealed at an annealing temperature in the range of about 600° C. to about 1200° C. for an annealing time of about 1 to about 100 minutes. The annealing may be performed by a heating procedure using a tubular furnace, a belt furnace, a resistance heated furnace, an infrared furnace, a furnace using halogen lamps and/or by Rapid Thermal Processing (RTP). The annealing of the coated wafer 10 may be conducted under inert atmosphere, for example N2, or reactive atmosphere, for example $N_2/H_2$, for instance at a temperature of about 700 to about 950° C. for an annealing time of about 15 to about 30 min. Thereby, phosphorus 22 diffuses into the wafer 10 and getters a substantial amount of the impurities 16. Furthermore, an amount of phosphorus diffuses at the interface between the silicon wafer 10 and the silicon compound layer 20 into the wafer 10 without gettering. Thereby, near the interface of the compound layer 20 and the wafer 10, an n-type emitter region 30 is formed. Furthermore, the front side 12 of the wafer 10 is coated with a silicon compound layer 20 which may be substantially depleted of phosphorus. Since silicon nitride or silicon carbide may be used as the silicon compound, the surface of the wafer 10 including the emitter region 30 may be passivated by layer 20.

Moreover, the layer 20 may act as an antireflective coating. Moreover, the annealing temperature may be in the range of about 950° C. to about 1200° C., typically at about 1100° C. Thereby, a thermal oxidation of the compound layer 20 may be additionally performed.

In the third step there is the formation of an emitter due to activation and diffusion of phosphorus into the wafers. Furthermore, in this step the gettering of the metallic impurities assisted by the presence of phosphorus in the layer is achieved. As a result, by the method according to embodiments, gettering of metallic impurities in the surface region and/or in the bulk region of a semiconductor wafer and emitter formation are performed simultaneously in one step. Further, surface passivation and/or antireflective coating may also be achieved.

In other examples of embodiments, the annealing temperature may be in the range of typically about 600 to about 1200° C., more typically about 650° C. to about 780° C. or about 750° C. to about 830° C., most typically about 700° C. to about 800° C.

In further examples of embodiments, the annealing time may in the range of typically about 1 to about 100 minutes, more typically about 75 to about 100 minutes or about 80 to about 90 minutes, most typically about 15 to about 30 minutes, or about 20 to about 30 minutes.

Figure 2A:
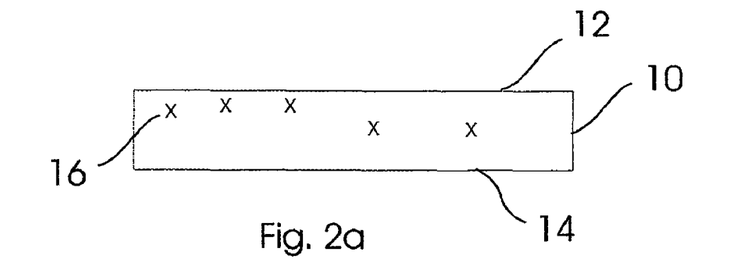
FIGS. 2a to 2d schematically illustrate steps of a semiconductor manufacturing method according to another example of embodiments.
Figure 2B:
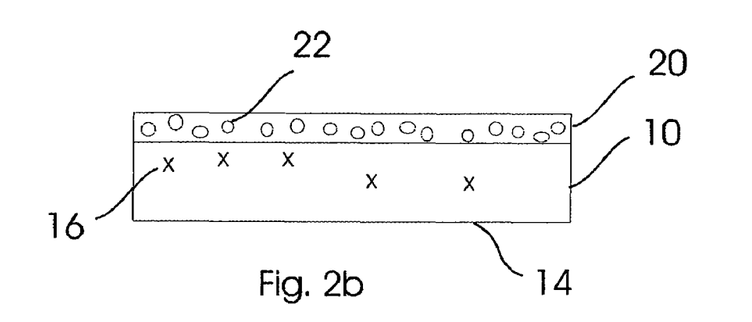
Figure 2C:
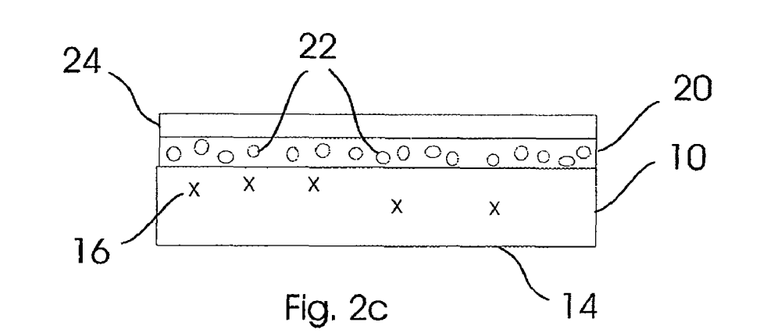

In some embodiments, during the step of depositing on the silicon substrate a silicon compound and a dope additive, two layers may be formed, e.g. two layers of the same composition. In other examples of embodiments, during the step of depositing on the silicon substrate a silicon compound and a dope additive, two layers of different compositions may be formed. An example of such an embodiment is schematically illustrated in FIGS. 2a to 2d. This example differs from the method illustrated with reference to FIGS. 1a to 1c in that during the second step two coating procedures are performed. First, the silicon compound layer 20 including phosphorus as dopant 22 is deposited on the front side 12 of the wafer 10 as shown in FIG. 2b. The additional coating procedure is illustrated in FIG. 2c, showing that on the layer 20 of the silicon compound including phosphorus, a layer 24 of a silicon compound not being doped with phosphorus is formed. Hence, during the third step shown in FIG. 2d, an amount of phosphorus diffuses at the interface between the silicon wafer 10 and the silicon compound layer 20 into the wafer. As a result, formation of the emitter region 30 and gettering of the impurities 16 of wafer 10 are performed simultaneously. Moreover, at the same time the layer 20 may provide a surface passivation, whereas layer 24 may provide antireflective properties.

In variations of the above example shown in FIGS. 2a to 2d, after the second step, the layer 20 may include silicon nitride and phosphorus, while layer 24 includes silicon nitride without being doped with phosphorus. According to another variation of this example, the layer 20 may include silicon carbide and phosphorus, while layer 24 includes silicon nitride without being doped with phosphorus. In a yet further variation of this example, the layer 20 may include silicon nitride and phosphorus, while layer 24 includes silicon carbide without being doped with phosphorus. Furthermore, the layer 20 may include silicon carbide and phosphorus, while layer 24 includes silicon carbide without being doped with phosphorus.

As mentioned above, before performing the annealing step, layer 20 may include silicon nitride and phosphorus or silicon carbide and phosphorus. In a further example schematically illustrated in FIGS. 3a to 3d, a coated wafer 10 may be formed, in which before annealing the layer 24 may include the same components as layer 20, the concentration of the dopant 22 being substantially equal or lower than in layer 20. In alternative examples (not shown), the concentration of the dopant 22 in layer 24 may be even higher than the concentration thereof in layer 20. As a result, the layer 20 may include phosphorus doped silicon nitride or phosphorus doped carbide, while layer 24 also includes phosphorus doped silicon nitride or phosphorus doped silicon carbide. The effects of these examples are the same as in the example explained with reference to FIGS. 1a to 1c: Gettering of metallic impurities in the surface region and/or in the bulk region of a semiconductor wafer, emitter formation, and in some cases surface passivation and antireflective coating may be performed simultaneously in one step.

Figure 2D:
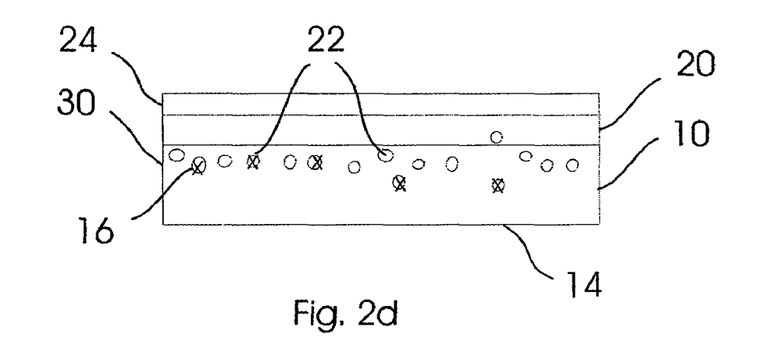
Figure 3A:
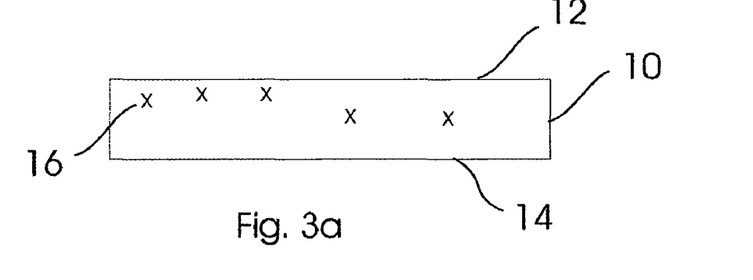
FIGS. 3a to 3d schematically illustrate steps of a semiconductor manufacturing method according to a further example of embodiments.
Figure 3B:
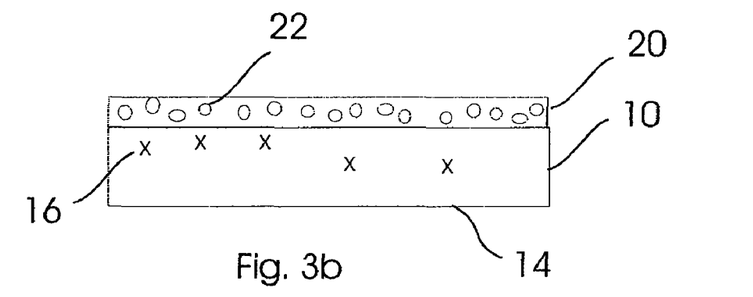
Figure 3C:
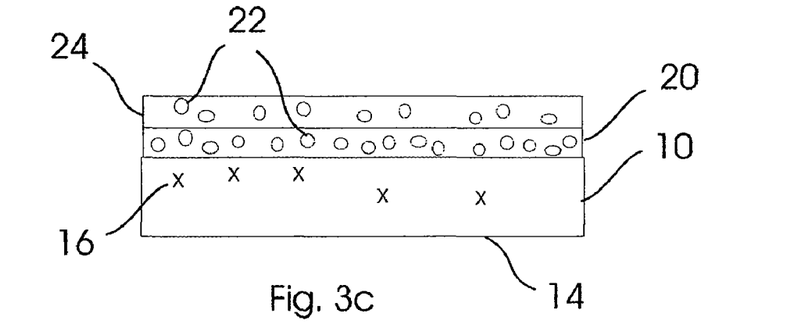
Figure 3D:
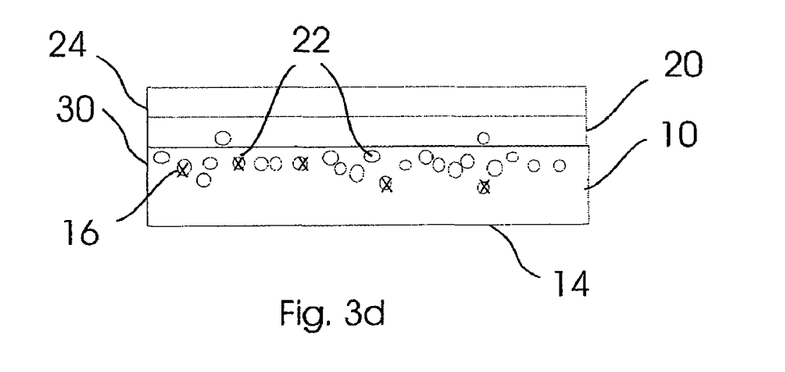

In a variation (not shown) of the example shown in FIGS. 2a to 2d and 3a to 3d, respectively, the two layers of the semiconductor compound may be formed by first depositing one of the layers on the semiconductor substrate and thereafter annealing using an annealing temperature and an annealing time as specified above and depositing the other layer followed by annealing using an annealing temperature and an annealing time as specified above. Moreover, in other variations (not shown) of the example of embodiments shown in FIGS. 2a to 2d, before annealing of both or each individual layer 20 and 24, the layer 20 of the semiconductor compound may be not doped with the dopant, whereas the layer 22 may include the dopant 22. In these variations, after annealing, the same structure as shown in FIG. 2d or FIG. 3d, respectively, may result.

Typical examples of the layer 20 and the layer 24 are a-SiC$_x$ and a-Si$_y$C$_x$, e.g. a-Si$_{0.8}$C$_{0.2}$, and a-SiN$_x$ and a-Si$_y$N$_x$, with x being in a range of typically 0 to about 1 and y being in a range of typically more than 0 to about 1. The thickness of the formed layer may be in the range of about 30 to about 120 nm. Moreover, suitable amounts of hydrogen and/or oxygen or of other components may be included in layers 20 and 24 for providing appropriate passivation and/or anti-reflective properties. An example of a layer 20 or 24 including hydrogen is hydrogenated, phosphorus doped amorphous silicon carbide, a-SiC$_x$(n):H, formed by PECVD from SiH$_4$, CH$_4$ and PH$_3$. An example of a layer 20 or 24 including oxygen is phosphorus doped silicon oxynitride grown by sputtering with a n-doped silicon target and N$_2$ and O$_2$ as reactive gases.

According to some embodiments, the silicon substrate may be selected from the group of a crystalline silicon substrate, a multi crystalline silicon substrate, a substrate having a crystalline silicon surface layer, and a substrate having a multi crystalline silicon surface layer.

As described above, according to some embodiments, the silicon substrate may be a p-type silicon substrate. In other embodiments, the silicon substrate may be an intrinsic silicon substrate, i.e. a silicon wafer 10 which is not doped. Moreover, according to some embodiments, the method may include a step of forming a layer of an intrinsic semiconductor material on the back side of the silicon wafer 10. Hence, in some embodiments, the front side of the wafer 10 may be provided with a layer of a doped a-silicon compound, whereas the back side may consist of an intrinsic material. Thereby, during performing the method, an emitter formation at the back side is avoided. In other embodiments, the method may include a step of forming a layer of a doped, e.g. p-doped, material on the back side of the silicon wafer 10. The formed back side layer may for instance be a boron-doped silicon surface layer. This may result in a passivated high-low junction at the back side of the coated wafer, e.g. a solar cell.

As mentioned above, with embodiments described herein, in a semiconductor device manufacturing method at least gettering of metallic impurities or of other lattice defects in the surface region and/or in the bulk region of a semiconductor wafer, and emitter formation may be performed simultaneously in one step. Further, while forming the emitter and gettering of impurities, surface passivation may be achieved. In the same step, also the formation of an antireflective coating may be accomplished. Furthermore, it is not required to remove a phosphorus silicate glass, since the phosphorus diffusion provided by embodiments disclosed herein does not result in the formation of a PSG region. In addition, an improved emitter profile of the produced semiconductor device or solar cell may result, e.g. the emitter profile may be sharper. Hence, the method of embodiments disclosed herein allows for a better control of the emitter profile. This can be based on a low speed of phosphorus diffusion into the wafer substrate, due to the choice of the semiconductor compound and the dopant, as well as of the annealing temperature and the annealing time. Consequently, a semiconductor device, such as a solar cell, having an improved emitter region, an improved surface passivation, a reduced charge carrier recombination and/or improved anti-reflective properties may be produced in a simplified manufacturing process. Hence, solar cell production costs can be decreased considerably.

In the following, further examples of embodiments are described.

In a first example, as a substrate a p-type, boron doped, multi-crystalline silicon wafer, with a resistivity of 1 Ohm cm and with a thickness 200 μm is used. The wafer has metallic impurities introduced during the crystal growth.

In the second step, a stack of two phosphorus doped amorphous silicon carbide passivation layers of a-SiC$_x$(n):H is deposited on the front side of the wafer. The deposition conditions are as follows: Reactor: PECVD, direct plasma, working at RF frequency (13.56 MHz); vacuum pressure in the reactor chamber of less than 10e-5 hPa; gas flows: SiH$_4$ (95%)+PH$_3$(5%): 3 sccm (Standard Cubic Centimeters); CH$_4$: 32 sccm; total pressure: 3 μbar; temperature: 300° C.; deposition time (static): 12 min; power density: 0.086 W/m$^2$. The formed a-SiC$_x$(n):H double layer has antireflective properties, a thickness of 80 nm and a refractive index of 2.00 at a wavelength of 622 nm.

In the third step, an annealing of the coated wafer is performed under N$_2$ atmosphere at a temperature of 830° C. and for an annealing time of 20 min. The precursor of the solar cell is formed. Only contacts need to be applied.

A second example differs from the first example in that after the second step and before the third step of annealing, a passivation of the back side of the wafer with an intrinsic amorphous silicon carbide film of a-SiC$_x$(i):H is performed. The deposition conditions correspond to the conditions specified in the second step, without the presence of phosphorus dopants. Reactor: PECVD, direct plasma, working at RF frequency (13.56 MHz); vacuum pressure in the reactor chamber of less than 10e-5 hPa; gas flows: SiH$_4$ (95%)+PH$_3$ (5%): 3 sccm; CH$_4$: 32 sccm; total pressure: 3 μbar; temperature: 300° C.; deposition time (static): 12 min; power density: 0.086 W/$^2$.

In a third example, the three steps of the first example are performed, however the third step being modified in that the coated wafer is annealed for 75 minutes at a temperature of 780° C.

In a fourth example, the third example is modified by performing the annealing of the coated wafer for 20 minutes at a temperature of 780° C.

According to one embodiment, a semiconductor device manufacturing method is provided, including: providing a semiconductor substrate, forming on the semiconductor substrate a layer including a semiconductor compound and a dope additive, and thereafter forming an emitter region and gettering impurities by annealing the semiconductor substrate including the layer. Thereby, the forming of the emitter region and gettering of impurities are performed in one step, typically simultaneously. The impurities may be gettered by the dope additive. The impurities may be metallic impurities or other lattice defects.

In one embodiment which may be combined with any other embodiment disclosed herein, the semiconductor substrate is a silicon substrate and the semiconductor compound is a silicon compound and the annealing is performed by heating at an annealing temperature in the range of about 600° C. to about 1200° C. for an annealing time of about 1 to about 100 minutes.

In one embodiment which may be combined with any other embodiment disclosed herein, in the step of forming the layer, a doped semiconductor compound layer is formed on the surface of the semiconductor substrate. The doped semiconductor layer may be amorphous.

In one embodiment which may be combined with any other embodiment disclosed herein, in the step of forming the layer, at least two layers of the same or different compositions are formed.

In one embodiment which may be combined with any other embodiment disclosed herein, in the step of forming the layer, at least two layers are formed, at least two of the layers including the same semiconductor compound or different semiconductor compounds.

In one embodiment which may be combined with any other embodiment disclosed herein, at least one semiconductor compound includes at least one element selected from the group consisting of a silicon compound, silicon carbide and silicon nitride.

In one embodiment which may be combined with any other embodiment disclosed herein, the dope additive includes at least one element selected from the group consisting of a p-type dopant, an n-type dopant, phosphorus and arsenic.

In one embodiment which may be combined with any other embodiment disclosed herein, the step of forming the layer is performed by sputtering of the semiconductor compound and the dope additive. Typically, a target including the semiconductor compound and the dope additive may be sputtered.

In one embodiment which may be combined with any other embodiment disclosed herein, the step of forming the layer is performed by PECVD of a gas mixture including SiH$_4$ and at least one element selected from the group consisting of NH$_3$, CH$_4$, and PH$_3$.

In one embodiment which may be combined with any other embodiment disclosed herein, in the step of annealing, the surface of the semiconductor substrate is oxidized.

In one embodiment which may be combined with any other embodiment disclosed herein, the semiconductor substrate is one element selected from the group of a silicon substrate, a crystalline silicon substrate, a multi crystalline silicon substrate, a substrate having a crystalline silicon surface layer, and a substrate having a multi crystalline silicon surface layer.

In one embodiment which may be combined with any other embodiment disclosed herein, the semiconductor substrate is at least one element selected from the group consisting of an n-type semiconductor substrate, a p-type semiconductor substrate, an intrinsic semiconductor substrate, an n-type silicon substrate, a p-type silicon substrate and an intrinsic silicon substrate.

In one embodiment which may be combined with any other embodiment disclosed herein, the annealing temperature is in the range of about 650 to about 780° C. or in the range of about 950° C. to about 1200° C.

In one embodiment which may be combined with any other embodiment disclosed herein, the annealing time is in the range of about 75 to about 100 minutes or in the range of about 15 to about 30 minutes.

In one embodiment which may be combined with any other embodiment disclosed herein, the semiconductor substrate includes a front side and a back side and the semiconductor compound layer is formed on the front side.

In one embodiment which may be combined with any other embodiment disclosed herein, a step of forming on the back side a layer including an intrinsic or a doped semiconductor compound is included. The doped semiconductor compound may be n-doped or p-doped, e.g. boron-doped.

In one embodiment which may be combined with any other embodiment disclosed herein, the annealing is performed by a heating procedure using at least one element selected from the group consisting of a tubular furnace, a belt furnace, a resistance heated furnace, an infrared furnace and halogen lamps.

In another embodiment, a semiconductor device is provided, obtainable by a semiconductor device manufacturing method, including: providing a semiconductor substrate, forming on the semiconductor substrate a layer including a semiconductor compound and a dope additive, and thereafter forming an emitter region and gettering impurities by annealing the semiconductor substrate including the layer.

In a further embodiment, a semiconductor device is provided, obtained by a semiconductor device manufacturing method, including: providing a semiconductor substrate, forming on the semiconductor substrate a layer including a semiconductor compound and a dope additive, and thereafter forming an emitter region and gettering impurities by annealing the semiconductor substrate including the layer.

According to a yet further embodiment, a semiconductor device manufacturing method is provided, substantially consisting of: providing a semiconductor substrate, forming on the semiconductor substrate a layer including a semiconductor compound and a dope additive, and thereafter forming an emitter region and gettering impurities by annealing the semiconductor substrate including the layer.

According to another embodiment, a semiconductor device is provided, which is obtainable by a method according to any of the preceding embodiments.

According to another embodiment, a semiconductor device is provided, which is obtained by a method according to any of the preceding embodiments.

According to a further embodiment, a semiconductor device manufacturing installation is provided, including a coating device adapted for coating a semiconductor substrate, a heating device adapted for annealing the coated semiconductor substrate, and a control device adapted for controlling the coating device and the heating device and adapted for performing a semiconductor device manufacturing method, the method including: providing a semiconductor substrate, forming on the semiconductor substrate a layer including a semiconductor compound and a dope additive, and thereafter forming an emitter region and gettering impurities by annealing the semiconductor substrate including the layer. For performing the step of providing the semiconductor substrate, a substrate support controlled by the control device, e.g. a transport system for transporting the substrate in front of the coating device, may be included in the manufacturing installation.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the embodiments described above may be combined with each other. The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

The invention claimed is:

1. A semiconductor device manufacturing method, comprising:
providing a semiconductor substrate;
forming on the semiconductor substrate a layer including a semiconductor compound and a dope additive; and thereafter
forming an emitter region and gettering impurities by annealing the semiconductor substrate including the layer in an inert atmosphere or in an $N_2/H_2$—atmosphere.

2. The method of claim 1, wherein the semiconductor substrate is a silicon substrate and the semiconductor compound is a silicon compound and the annealing is performed by heating at an annealing temperature of about 600° C. to about 1200 ° C. for an annealing time of about 1 to about 100 minutes.

3. The method of claim 1, wherein, in the forming the layer, at least two layers are formed, and further wherein at least two of the layers include the same semiconductor compound or different semiconductor compounds.

4. The method of claim 1, wherein the semiconductor compound includes at least one compound selected from the group consisting of a silicon compound, silicon carbide and silicon nitride.

5. The method of claim 1, wherein the dope additive includes at least one element selected from the group consisting of a p-type dopant and an n-type dopant.

6. The method of claim 5, wherein the n-type dopant is at least one of phosphorus and arsenic.

7. The method of claim 1, wherein the forming the layer is performed by sputtering of the semiconductor compound and the dope additive.

8. The method of claim 1, wherein the forming the layer is performed by PECVD of a gas mixture including $SiH_4$ and at least one compound selected from the group consisting of $NH_3$, $CH_4$, and $PH_3$.

9. The method of claim 1, wherein the semiconductor substrate is one from the group of a silicon substrate, a crystalline silicon substrate, a multi crystalline silicon substrate, a substrate having a crystalline silicon surface layer, a substrate having a multi crystalline silicon surface layer, an n-type semiconductor substrate, a p-type semiconductor substrate, an intrinsic semiconductor substrate, an n-type silicon substrate, a p-type silicon substrate, and an intrinsic silicon substrate.

10. The method of claim 1, wherein the annealing is performed at a temperature from about 650° C. to about 780° C. or about 950° C. to about 1200° C.

11. The method of claim 1, wherein the annealing is performed for a time from about 75 to about 100 minutes or about 15 to about 30 minutes.

12. The method of claim 1, wherein the semiconductor substrate includes a front side and a back side and the layer including the semiconductor compound is formed on the front side.

13. The method of claim 12, further comprising:
forming on the back side a layer including an intrinsic or doped semiconductor compound.

14. The method of claim 12, wherein an emitter formation at the back side is avoided.

15. The method of claim 1, wherein the layer including the semiconductor compound is not at least partly removed.

16. The method of claim 1, wherein the annealing is performed by a tubular furnace, a belt furnace, a resistance heated furnace, an infrared furnace, or halogen lamps.

17. The method of claim 1, wherein the annealing does not result in the formation of a PSG region.

* * * * *